(12) United States Patent
Bang

(10) Patent No.: US 9,870,194 B2
(45) Date of Patent: Jan. 16, 2018

(54) MULTI-SCREEN DISPLAY DEVICE HAVING LIGHT-TRANSMISSIVE COVER WITH INVISIBLE BEZEL

(71) Applicant: Chaewon Bang, Gyeonggi-do (KR)

(72) Inventor: Chaewon Bang, Gyeonggi-do (KR)

( * ) Notice: Subject to any disclaimer, the term of this patent is extended or adjusted under 35 U.S.C. 154(b) by 50 days.

(21) Appl. No.: 15/034,086

(22) PCT Filed: Nov. 19, 2014

(86) PCT No.: PCT/KR2014/011123
§ 371 (c)(1),
(2) Date: May 3, 2016

(87) PCT Pub. No.: WO2015/076552
PCT Pub. Date: May 28, 2015

(65) Prior Publication Data
US 2016/0283183 A1    Sep. 29, 2016

(30) Foreign Application Priority Data

Nov. 22, 2013 (KR) .......................... 10-2013-0142575

(51) Int. Cl.
| | |
|---|---|
| G06F 3/14 | (2006.01) |
| G09F 9/00 | (2006.01) |
| G09F 9/30 | (2006.01) |
| G09F 9/302 | (2006.01) |
| G02F 1/1333 | (2006.01) |
| G09F 15/00 | (2006.01) |
| G02F 1/1335 | (2006.01) |

(52) U.S. Cl.
CPC ........ *G06F 3/1446* (2013.01); *G02F 1/13336* (2013.01); *G02F 1/133504* (2013.01); *G09F 9/00* (2013.01); *G09F 9/30* (2013.01); *G09F 9/3026* (2013.01); *G09F 15/0012* (2013.01); *G02F 2001/133331* (2013.01); *G09G 2300/026* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 9,354,361 B2 * | 5/2016 | Wang | ................. G02B 5/04 |
| 9,612,468 B1 * | 4/2017 | Liu | ................. G02F 1/13336 |

(Continued)

FOREIGN PATENT DOCUMENTS

KR    101178634    8/2012

*Primary Examiner* — Duane N Taylor, Jr.
(74) *Attorney, Agent, or Firm* — IPLA P.A.; James E. Bame

(57) ABSTRACT

A multi-screen display device including a light transmissive cover with an invisible bezel includes: a plurality of screen display units (11); bezels (12) formed between the screen display units (11); and a plurality of light transmissive covers (120), each of which has a rear surface (110*a*), a front surface (110*c*), and a side surface (110*b*), and is provided to the screen display units (11) while outer peripheral circumferences (120') of the front surfaces (120*c*) of the adjacent light transmissive covers are in contact with each other, and is provided to the screen display unit (11) so that the bezel (12) is positioned between the pair of facing inclined side surfaces (120*b*) of the adjacent light transmissive covers (120). Accordingly, there is an advantage in that the bezel is invisible.

14 Claims, 15 Drawing Sheets

(56) References Cited

U.S. PATENT DOCUMENTS

| | | |
|---|---|---|
| 2008/0186253 A1 | 8/2008 | Li |
| 2010/0238090 A1* | 9/2010 | Pomerantz .......... G02F 1/13336 345/1.3 |
| 2011/0267541 A1* | 11/2011 | Hirokane ................. G09G 3/36 348/671 |
| 2015/0015974 A1* | 1/2015 | Jeong ....................... H04N 9/12 359/811 |
| 2015/0116852 A1* | 4/2015 | Kim .................... G02B 17/002 359/834 |
| 2016/0245995 A1* | 8/2016 | Feil .................... G02F 1/13336 |

* cited by examiner

[Fig. 1]
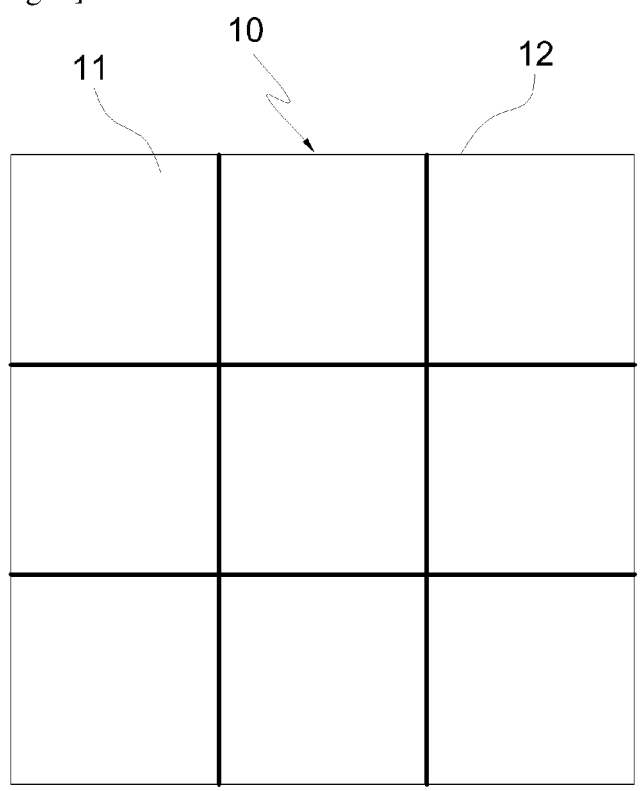

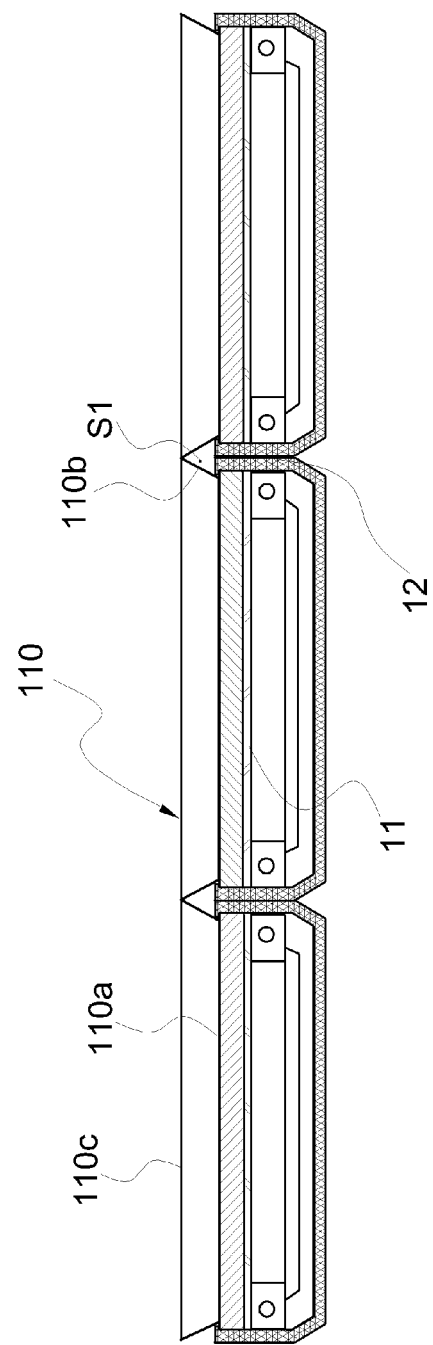
[Fig. 2]

[Fig. 3]
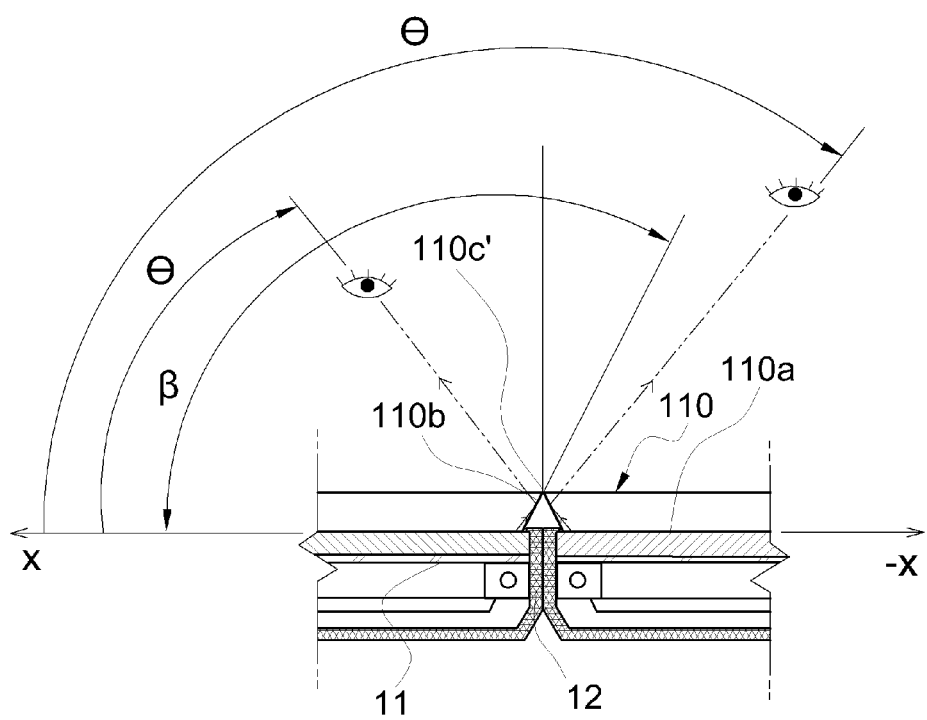

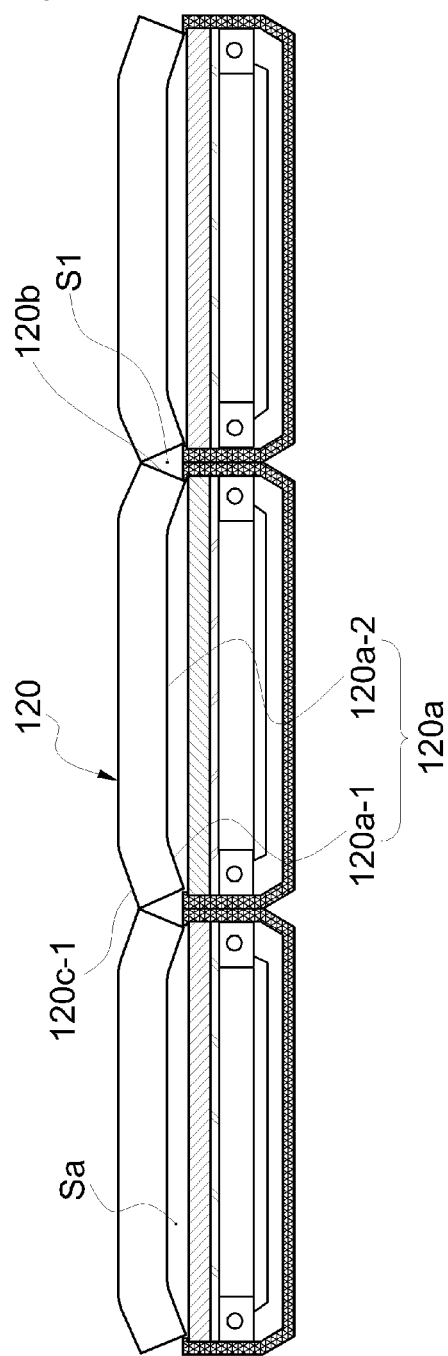
[Fig. 4]

[Fig. 5]
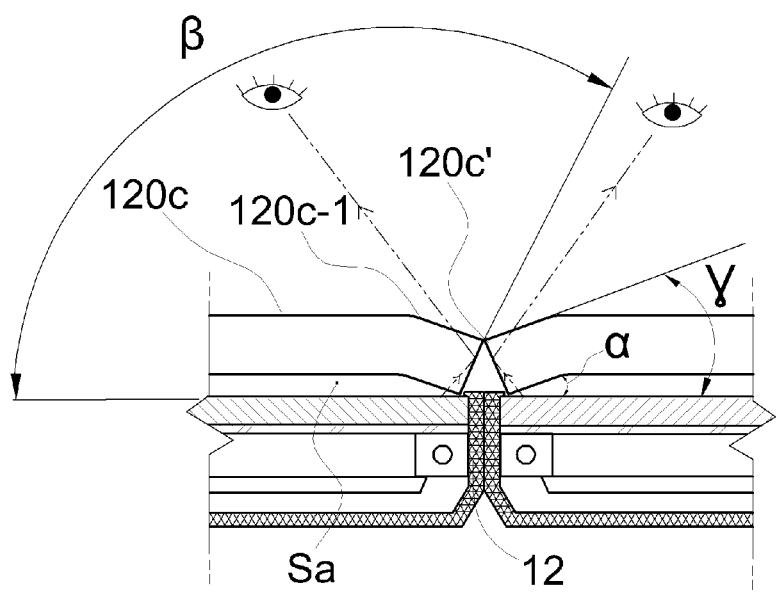

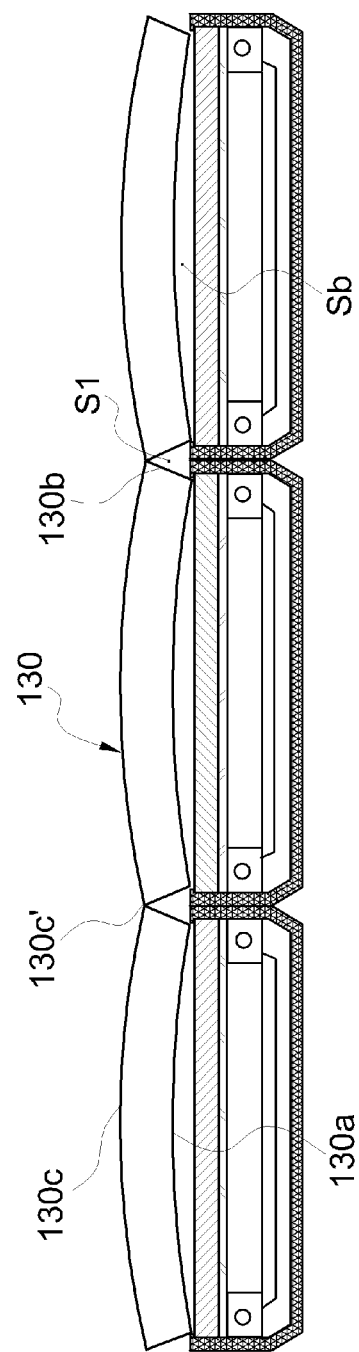
[Fig. 6]

[Fig. 7]
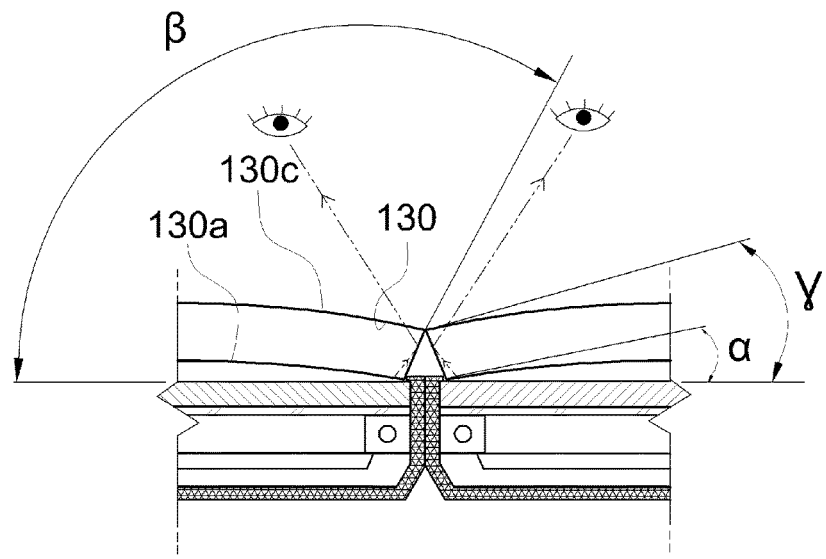
[Fig. 8]
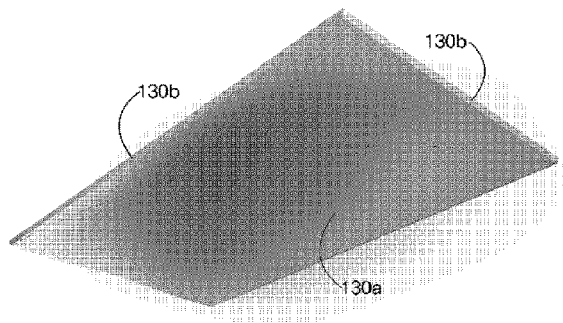
[Fig. 9]
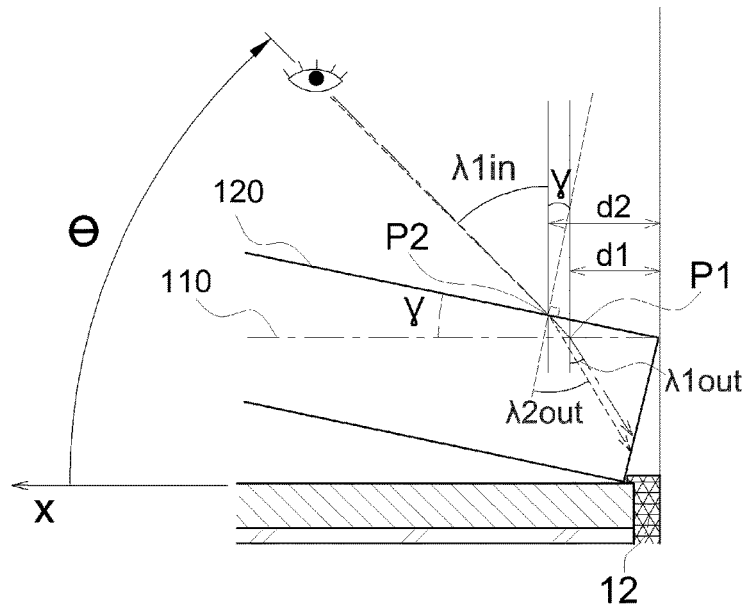

[Fig. 10]
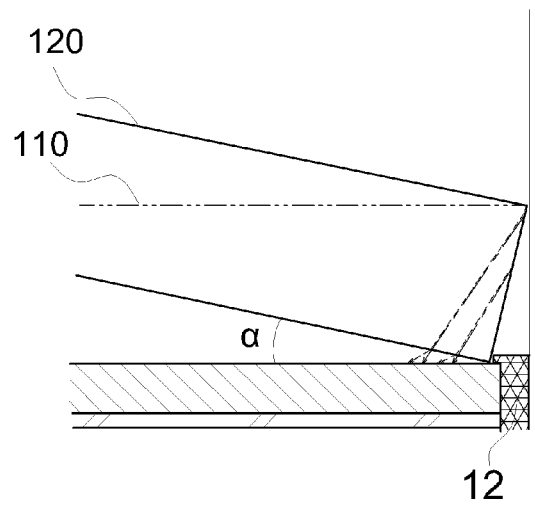

[Fig. 11]
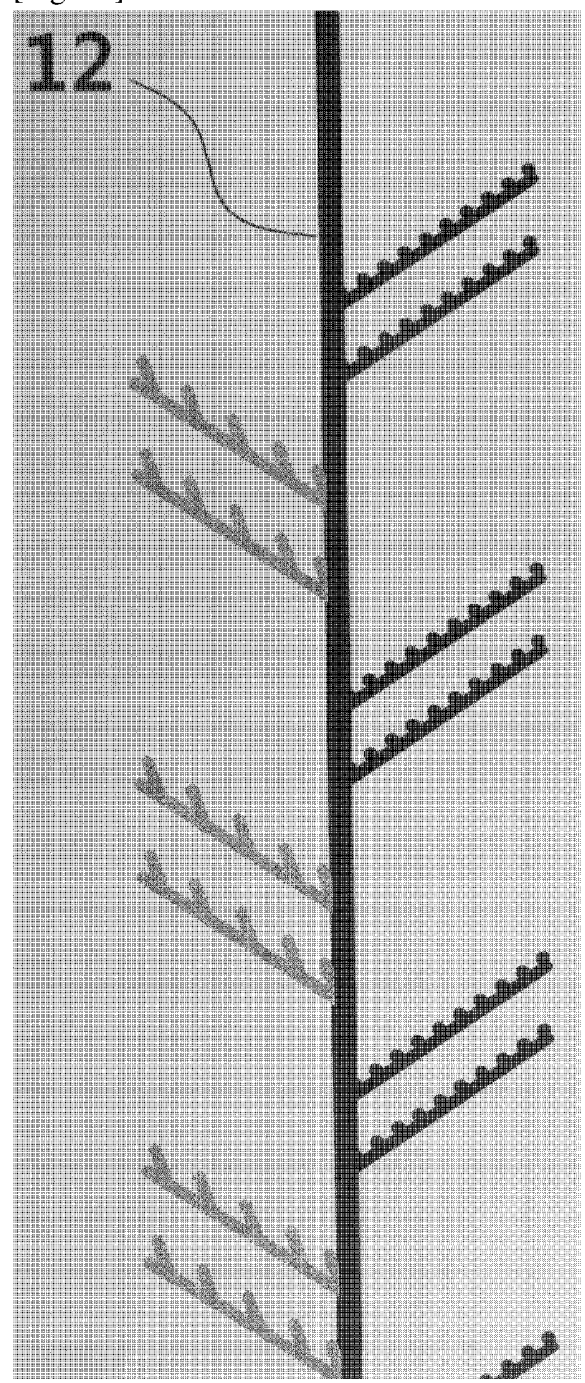

[Fig. 12]
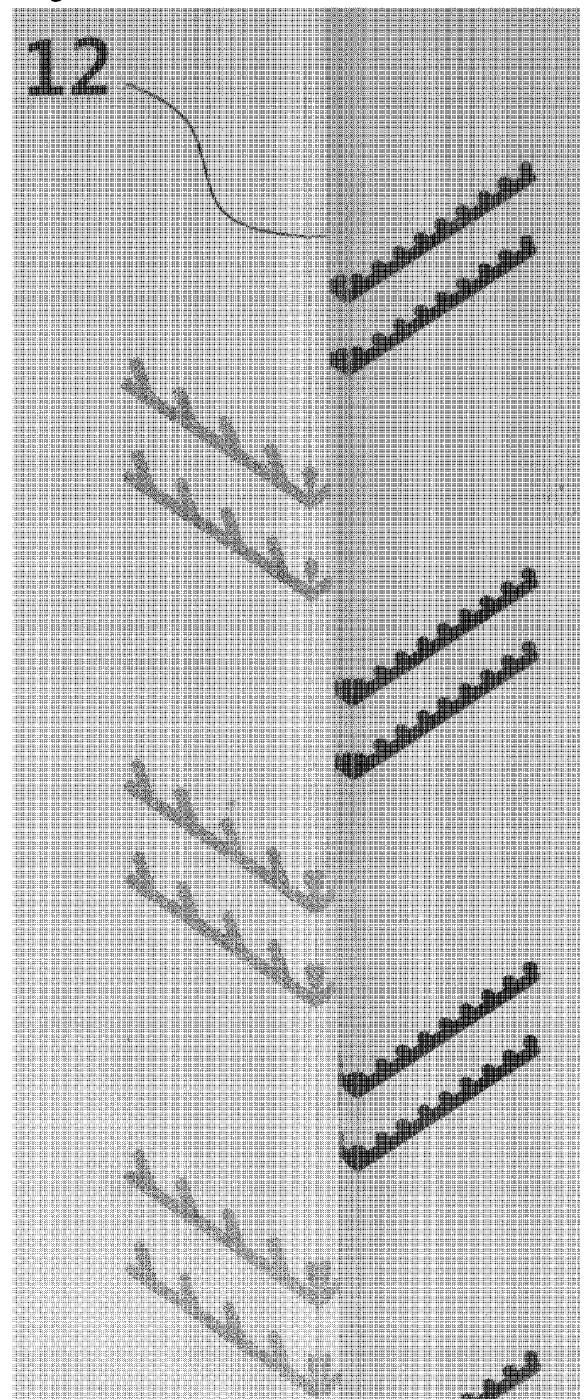

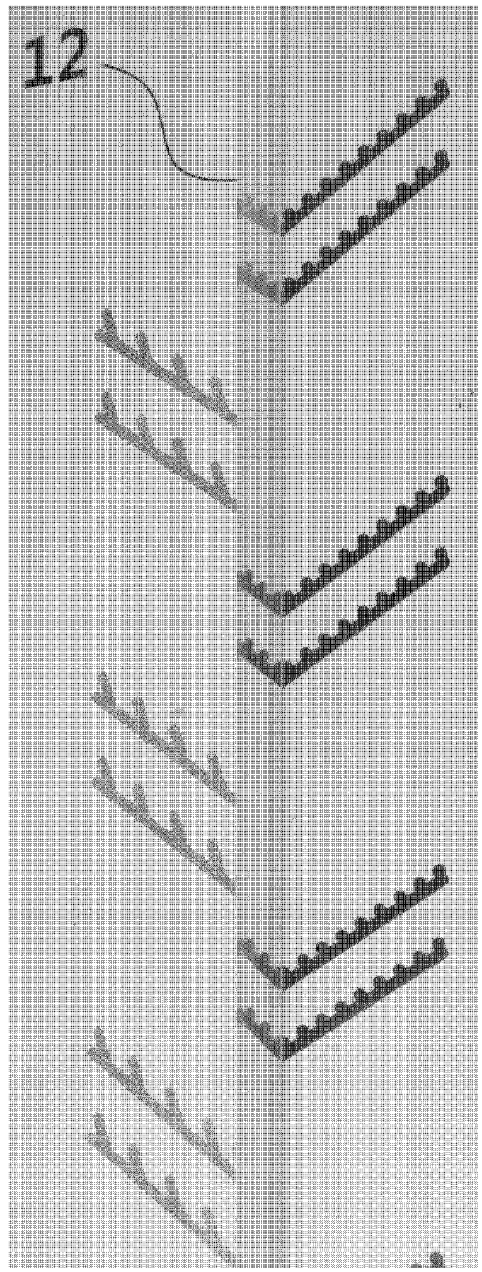
[Fig. 13]

[Fig. 14]
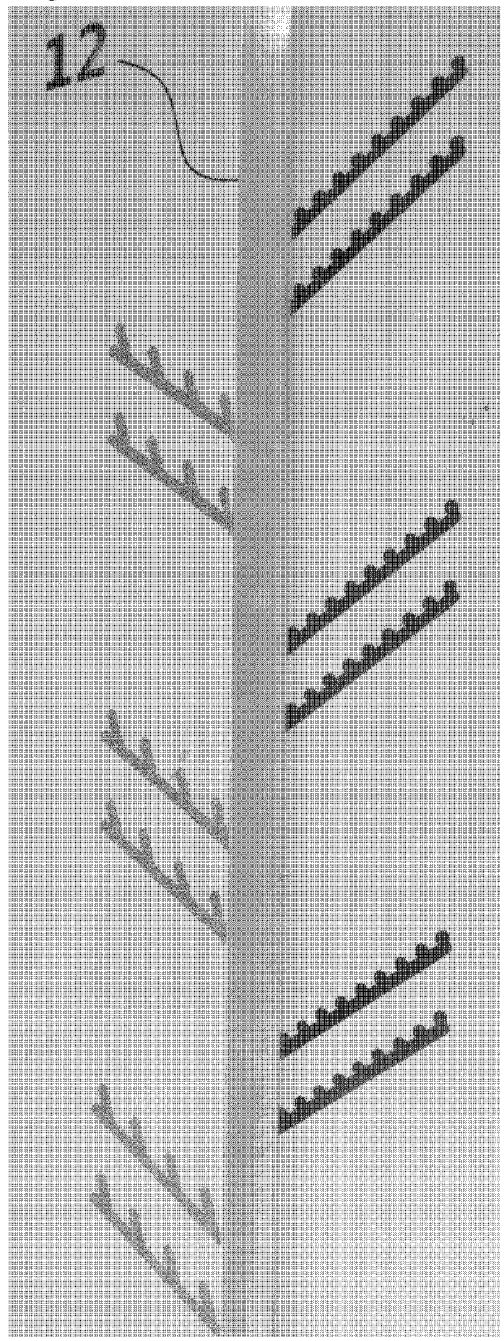

[Fig. 15]
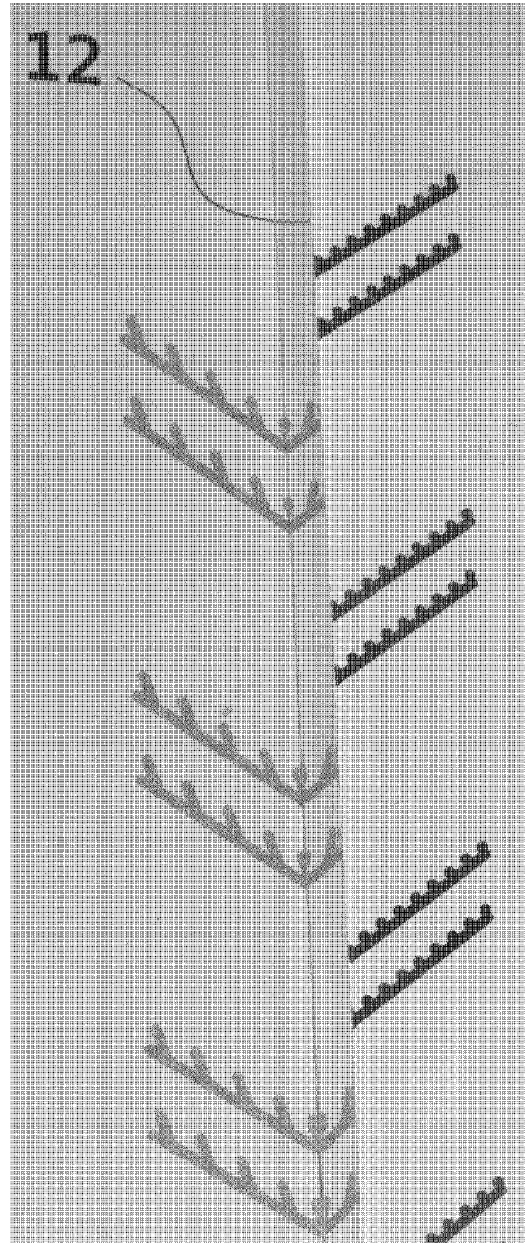

[Fig. 16]
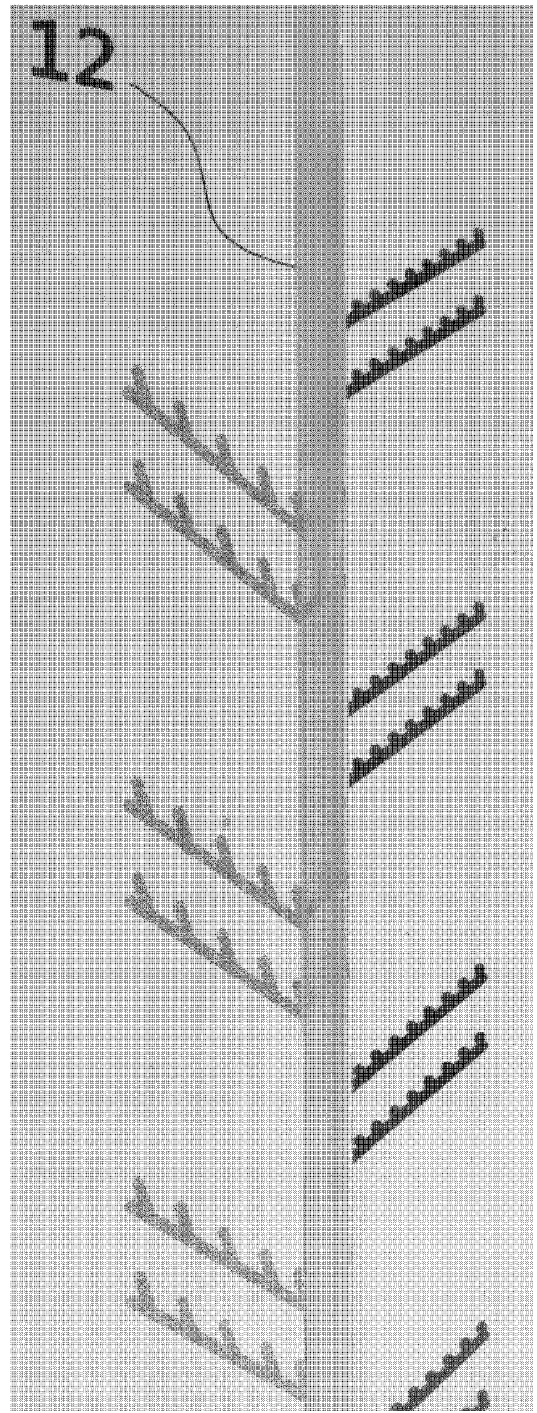

[Fig. 17]
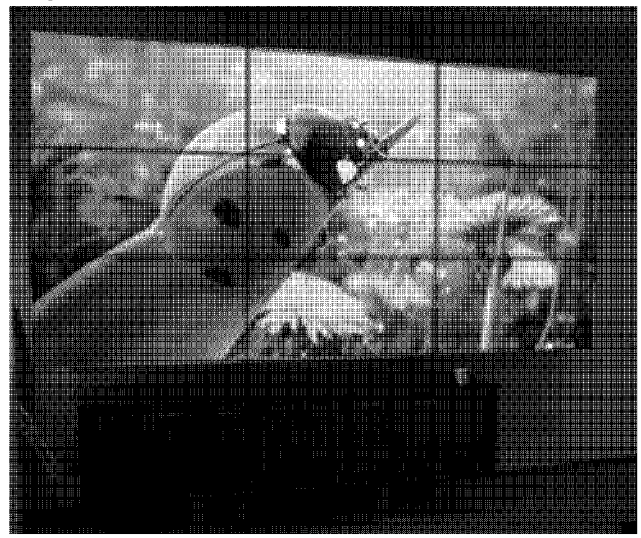
[Fig. 18]
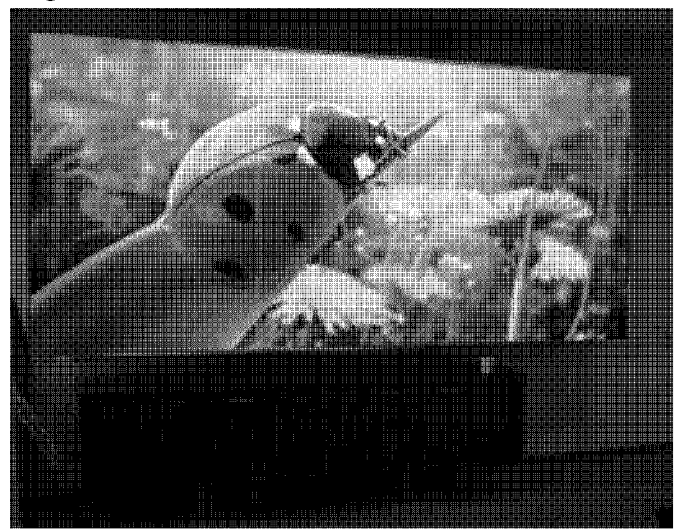

MULTI-SCREEN DISPLAY DEVICE HAVING LIGHT-TRANSMISSIVE COVER WITH INVISIBLE BEZEL

BACKGROUND

The present invention relates to a multi-screen display device, and more particularly, to a multi-screen display device including a light transmissive cover with an invisible bezel, in which a unique light transmissive cover of the present invention is provided to a publicly known multi-screen display device to make a bezel be invisible by an optical illusion, so that an image on a screen may implement continuity without disconnection, and further, which is appropriate for a usual commercial purpose by maximizing a viewing angle essentially required for commercialization, as well as a screen viewed from a front side.

In general, a flat panel display device, such as a Liquid Crystal Display (LCD) or a Plasma Discharge Panel (PDP), easily implements high resolution, and has various advantages as a high quality and large screen display device.

However, the large screen display device requires the large amount of cost for manufacturing a large screen and has a limit in a size of a screen display unit (display panel) due to a problem in the manufacturing.

FIG. 1 illustrates an example of a general multiple screen-display device 10 using multiple screen display units 11. As illustrated in FIG. 1, the multi-screen display device 10 is configured by disposing a plurality of screen display units (display panels) 11 having about 40 inches or more in a plurality of rows and columns. In this case, although not illustrated, each screen display unit 11 includes multilayered glass substrates, in which liquid crystal or plasma gas is sealed, and a Black light Unit (BLU) which is installed at a rear side of the glass substrate and radiates light. Further, bezels 12, which are external configuration components, such as a chassis, are installed at outer portions of the respective screen display units 11 and boundaries between the outer portions of the screen display units 11.

Originally, the term "bezel" means a boundary fixing a watch glass, but is presently used as a term meaning a boundary of the screen display units in various monitors, such as an LCD.

Typically, the outer portion of a glass substrate includes a region, in which a drive Integrated Circuit (IC) or other printed circuits are installed, and an image is not displayed in the region. Further, in order to assemble the multilayered glass substrates and the BLUs, the external constituent component, such as a chassis, is accompanied. Accordingly, as illustrated in FIG. 1, the bezels 12 inevitably occupy considerable regions at the outer portions of front parts of the screen display units 11 and the boundaries of the screen display units 11, and the region, in which an image is not displayed, is generated in a region, in which the bezel 12 is present, that is, a border portion between the screen display units 11.

Particularly, contrary to the past, a line interval at the bezel, that is, the boundary, is generated in a multi-screen requiring several monitors, such as LCDs, so that many problems are caused in transferring image information, and thus interest in the bezel have been recently increased.

The technology developed for solving the problem in that an image is disconnected in the bezel region is disclosed in Korean Patent Application Laid-Open No. 10-2011-0065627 (published on Jun. 16, 2011, and entitled "Multi-vision Screen Device").

The core point of the technology under Korean Patent Application Laid-Open No. 10-2011-0065627 is to adopt a reflector 130, which is installed in a spaced portion 120 with the same pattern as that of the spaced portion 120, and reflects an image displayed on a screen and exposes the reflected image to the outside by a size of the spaced portion 120, and detailed technical contents are described in the Publication, so that detailed descriptions thereof will be omitted.

However, the technology under Korean Patent Application Laid-Open No. 10-2011-0065627 has a problem below.

When the technology under Korean Patent Application Laid-Open No. 10-2011-0065627 is actually carried out, the reflector fails to reflect the image unlike the illustration in the drawing of the Publication, so that a black bezel part is visible as it is. Further, even though a vertex part of the reflector is disposed in a down direction, the same problem, that is, the problem in that the bezel is visible as it is, is not solved.

SUMMARY OF THE INVENTION

The present invention is to conceived to solve the aforementioned problems in the related art, and first, the present invention has been made in an effort to provide a multi-screen display device including a light transmissive cover with an invisible bezel, in which light transmissive covers are one-to-one provided to screen display units of the multi-screen display device, in such a manner that the light transmissive cover does not cover only a part of the screen display unit, but covers the entire screen display unit, thereby making the bezel be visually invisible and protecting the screen display unit.

Second, the present invention has been made in an effort to provide a multi-screen display device including a light transmissive cover with an invisible bezel, in which the bezel is invisible not that by an electronic circuit method or a program processing method of image data, but that the light transmissive cover is disposed in the screen display unit so that the bezel is positioned within a space formed by facing side surfaces of a pair of contacted light transmissive covers, in which the light transmissive covers formed with the inclined side surfaces face each other, so that the bezel is invisible only by the configuration of the simple light transmissive cover, thereby remarkably decreasing costs of a product for making a bezel be invisible.

Third, the present invention has been made in an effort to provide a multi-screen display device including a light transmissive cover with an invisible bezel, in which the light transmissive cover is disposed in the screen display unit so that the bezel is positioned within the space formed by the facing side surfaces of the light transmissive covers, in such a matter that a side surface, a rear surface, and a front surface of the light transmissive cover are present within a predetermined angle range with respect to the screen display unit, so that the bezel is invisible, and an image of the screen display unit is reflected to the side surface, and thus a user may recognize as if the image is normally displayed on the side surface, like the screen display unit.

Fourth, the present invention has been made in an effort to provide a multi-screen display device including a light transmissive cover with an invisible bezel, in which a real image is not displayed on the side surface of the light transmissive cover unlike the screen display unit, but a reflected image of the image displayed on the screen display unit is displayed on the side surface of the light transmissive cover, but considering a fact that an area of the side surface is not large and the image displayed on the screen display unit is mainly a dynamic image, a user has optical illusion as if the reflected image displayed on the side surface is the actual image, and as a result, the user recognizes as if a whole image is displayed throughout the entire display device without a disconnection feeling, thereby improving an image providing environment of the display.

Fifth, the present invention has been made in an effort to provide a multi-screen display device including a light transmissive cover with an invisible bezel, in which an image of the screen display unit is totally reflected to the side surface of the light transmissive cover by a geometrical optical figurative characteristic of the light transmissive cover, so that the bezel is invisible.

Sixth, the present invention has been made in an effort to provide a multi-screen display device including a light transmissive cover with an invisible bezel, in which a space is formed between the screen display units by a geometrical shape of the light transmissive cover, so that the space serves as a heat radiating space radiating heat generated in the screen display unit, thereby decreasing thermal damage to the screen display unit.

Seventh, the present invention has been made in an effort to provide a multi-screen display device including a light transmissive cover with an invisible bezel, in which a promotional material may be inserted into the space.

Eighth, the present invention has been made in an effort to provide a multi-screen display device including a light transmissive cover with an invisible bezel, in which outer sides of a front surface and a rear surface of the light transmissive cover are surface-inclined in a front direction, or a front surface and a rear surface of the light transmissive cover are convexly formed in the front direction to be curved, so that a viewing angle, at which the bezel is invisible, is considerably increased at the side, and thus the bezel is invisible even though a user views the display device at the side.

Ninth, the present invention has been made in an effort to provide a multi-screen display device including a light transmissive cover with an invisible bezel, in which a viewing angle, at which the bezel is invisible, is maximized, so that it is possible to secure a wide viewing angle, which is essential to the commercialization, thereby increasing a possibility of success in popularization and commercialization of the display device.

An exemplary embodiment of the present invention provides a multi-screen display device including a light transmissive cover with an invisible bezel, the multi-screen display device including: a plurality of screen display units; bezels formed between the screen display units; and a plurality of light transmissive covers, each of which has a rear surface facing the screen display unit, a front surface that is an opposite surface of the rear surface, and a side surface connecting the front surface and the rear surface, and is provided to the front surfaces of the screen display units so as to cover the screen display units while one-to-one corresponding to the screen display units, the side surface being inclined to be widened outwardly in a front direction, wherein the plurality of light transmissive covers is provided to the screen display units while outer peripheral circumferences of the front surfaces of the adjacent light transmissive covers are in contact with each other, the light transmissive cover is provided to the screen display unit so that the bezel is positioned between the pair of facing inclined side surfaces of the adjacent light transmissive covers in order to prevent the bezel from being visible, a rear surface inclined portion is surface-inclined in the front direction at an outer side of the rear surface of the light transmissive cover, and a rear surface flat portion is flatly formed while being bent inwardly from the rear surface inclined portion, a front surface inclined portion is surface-inclined at an outer side of the front surface of the light transmissive cover in the front direction, and a front surface flat portion is flatly formed while being bent inwardly from the front surface inclined portion, and a space is formed between the screen display unit and the rear surface of the light transmissive cover.

An exemplary embodiment of the present invention provides a multi-screen display device including a light transmissive cover with an invisible bezel, the multi-screen display device including: a plurality of screen display units; bezels formed between the screen display units; and a plurality of light transmissive covers, each of which has a rear surface facing the screen display unit, a front surface that is an opposite surface of the rear surface, and a side surface connecting the front surface and the rear surface, and is provided to the front surfaces of the screen display units so as to cover the screen display units while one-to-one corresponding to the screen display units, the side surface being inclined to be widened outwardly in a front direction, wherein the plurality of light transmissive covers is provided to the screen display units while outer peripheral circumferences of the front surfaces of the adjacent light transmissive covers are in contact with each other, the light transmissive cover is provided to the screen display unit so that the bezel is positioned between the pair of facing inclined side surfaces of the adjacent light transmissive covers in order to prevent the bezel from being visible, the front surface and the rear surface of the light transmissive cover are convexly formed in a front direction so as to be curved, and a space is formed between the screen display unit and the rear surface of the light transmissive cover.

An exemplary embodiment of the present invention provides a multi-screen display device including a light transmissive cover with an invisible bezel, the multi-screen display device including: a plurality of screen display units; bezels formed between the screen display units; and a plurality of light transmissive covers each of which has a rear surface facing the screen display unit, a front surface that is an opposite surface of the rear surface, and a side surface connecting the front surface and the rear surface, and is provided to the front surfaces of the screen display units so as to cover the screen display units while one-to-one corresponding to the screen display units, the side surface being inclined to be widened outwardly in a front direction, wherein the plurality of light transmissive covers is provided to the screen display units while outer peripheral circumferences of the front surfaces of the adjacent light transmissive covers are in contact with each other, and the light transmissive cover is provided to the screen display unit so that the bezel is positioned between the pair of facing inclined side surfaces of the adjacent light transmissive covers in order to prevent the bezel from being visible.

The multi-screen display device including the light transmissive cover with the invisible bezel of the present invention including the aforementioned configuration has the effects below.

First, light transmissive covers are one-to-one provided to screen display units of the multi-screen display device, in such a manner that the light transmissive cover does not cover only a part of the screen display unit, but covers the entire screen display unit, so that it is possible to make the bezel be visually invisible and protect the screen display unit.

Second, the bezel is invisible not that by an electronic circuit method or a program processing method of image data, but that the light transmissive cover is disposed in the screen display unit so that the bezel is positioned within a space formed by facing side surfaces of a pair of contacted light transmissive covers, in which the light transmissive covers formed with the inclined side surfaces face each other, so that the bezel is invisible only by the configuration of the simple light transmissive cover, thereby remarkably decreasing costs of a product for making a bezel be invisible.

Third, the light transmissive cover is disposed in the screen display unit so that the bezel is positioned within the space formed by the facing side surfaces of the light transmissive covers, in such a matter that a side surface, a rear surface, and a front surface of the light transmissive cover are present within a predetermined angle range with respect to the screen display unit, so that the bezel is invisible, and an image of the screen display unit is reflected to the side surface, and thus a user may recognize as if the image is normally displayed on the side surface, like the screen display unit.

Fourth, a real image is not displayed on the side surface of the light transmissive cover unlike the screen display unit, but a reflected image of the image displayed on the screen display unit is displayed on the side surface of the light transmissive cover, but considering a fact that an area of the side surface is not large and the image displayed on the screen display unit is mainly a dynamic image, a user has optical illusion as if the reflected image displayed on the side surface is the actual image, and as a result, the user recognizes as if a whole image is displayed throughout the entire display device without a disconnection feeling, thereby improving an image providing environment of the display.

Fifth, an image of the screen display unit is totally reflected to the side surface of the light transmissive cover by a geometrical optical figurative characteristic of the light transmissive cover, so that the bezel is invisible.

Sixth, a space is formed between the screen display units by a geometrical shape of the light transmissive cover, so that the space serves as a heat radiating space radiating heat generated in the screen display unit, thereby decreasing thermal damage to the screen display unit.

Seventh, a promotional material may be inserted into the space.

Eighth, outer sides of a front surface and a rear surface of the light transmissive cover are surface-inclined in a front direction, or a front surface and a rear surface of the light transmissive cover are convexly formed in the front direction to be curved, so that a viewing angle, at which the bezel is invisible, is considerably increased at the side, and thus the bezel is invisible even though a user views the display device at the side.

Ninth, a viewing angle, at which the bezel is invisible, is maximized, so that it is possible to secure a wide viewing angle, which is essential to the commercialization, thereby increasing a possibility of success in popularization and commercialization of the display device.

BRIEF DESCRIPTION OF DRAWINGS

FIG. 1 is a conceptual diagram of a general multi-screen display device.

FIG. 2 is a conceptual cross-sectional view of a case where light transmissive covers 110 with invisible bezels are provided to a multi-screen display device according to a first exemplary embodiment of the present invention.

FIG. 3 is an enlarged view of a main part of FIG. 2.

FIG. 4 is a conceptual cross-sectional view of a case where light transmissive covers 120 are provided to a multi-screen display device according to a second exemplary embodiment of the present invention.

FIG. 5 is an enlarged view of a main part of FIG. 4.

FIG. 6 is a conceptual cross-sectional view of a case where light transmissive covers 130 are provided to a multi-screen display device according to a third exemplary embodiment of the present invention.

FIG. 7 is an enlarged view of a main part of FIG. 6.

FIG. 8 is a perspective view illustrating a bottom surface of a modelling of the light transmissive cover 130 according to the third exemplary embodiment of the present invention.

FIGS. 9 and 10 are diagrams for explaining a reason why viewing angles of the light transmissive covers 120 and 130 according to the second and third exemplary embodiments of the present invention are larger than a viewing angle θ of the light transmissive cover 110 according to the first exemplary embodiment of the present invention.

FIG. 11 is a picture of an experiment, in which a bezel 12 and a screen display unit 11 for a test are visible in a state where the light transmissive covers 110, 120, and 130 with the invisible bezels according to the exemplary embodiments of the present invention are not present.

FIG. 12 is a use state view, in which a user views the display device at a position of 90° (a right center position) in a case where a pair of light transmissive covers 110, 120, and 130 with the invisible bezels according to the exemplary embodiments of the present invention is disposed based on the bezel 12, and is a picture of an experiment representing that the bezel 12 is invisible.

FIG. 13 is a picture of an experiment of a case where a user views the display device with an inclination by about 30° in a right direction in FIG. 12.

FIG. 14 is a picture of an experiment of a case where a user views the display device while deviating from an outermost viewing angle by further leaning in the right direction in FIG. 13.

FIG. 15 is a picture viewed at a symmetric angle of FIG. 13.

FIG. 16 is a picture viewed at a symmetric angle of FIG. 13.

FIG. 17 is a screen picture in a case where the light transmissive cover with the invisible bezel according to the exemplary embodiment of the present invention is not provided to a screen display unit in a state where an image is displayed on the screen display unit of the general multi-screen display device.

FIG. 18 is a screen picture of a case where the light transmissive cover with the invisible bezel according to the exemplary embodiment of the present invention is provided to the screen display unit of FIG. 17.

EXPLANATION OF REFERENCE NUMERALS AND SYMBOLS

11: Screen display unit 12: Bezel
110, 120, 130: Light transmissive covers according to first, second, and third exemplary embodiments of the present invention
110a, 120a, 130a: Rear surface of light transmissive cover
110b, 120b, 130b: Side surface of light transmissive cover
110c, 120c, 130c: Front surface of light transmissive cover

110c', 120c': Outer peripheral circumference of front surface of light transmissive cover

DETAILED DESCRIPTION OF THE INVENTION

Hereinafter, an exemplary embodiment of a multi-screen display device including a light transmissive cover with an invisible bezel of the present invention will be described in detail with reference to the accompanying drawings.

A "viewing angle θ" described in the present specification is an angle, at which a user views a display device, and a value of a viewing angle is increased based on an x-axis illustrated in FIG. 3 (accordingly, a viewing angle in the x-axis=0°) in a clockwise direction.

An "outermost viewing angle" described in the present specification is an angle, is an angle at an outermost portion, at which a user may view images, which are reflected from images of screen display units and are displayed on side surfaces 110b, 120b, and 130b of light transmissive covers 110, 120, and 130 (surfaces formed along circumferences of the light transmissive covers, that is, circumferential surfaces), based on a right center (viewing angle θ=90°). For example, when a value of the outermost viewing angle in the x-axis is θm, a value of the outermost viewing angle in a −x-axis may be 180°−θm°.

Accordingly, when the user views the display device within the range of the outermost viewing angle, the user may view images of screen display units 11, which are reflected and displayed on the side surfaces 110b, 120b, and 130b, and as a result, the user visually recognizes as if the images are displayed even on the side surfaces 110b, 120b, and 130b of the light transmissive covers 110, 120, and 130.

Further, in the exemplary embodiment of the present invention, the outermost viewing angle is, for example, 30°, in the x-axis direction, and is (180°−30°) in the −x-axis direction.

The multi-screen display devices including light transmissive covers with invisible bezels according to first, second, and third exemplary embodiments of the present invention include a plurality of screen display units 11 and bezels 12 formed between the screen display units 11, and further include a plurality of light transmissive covers 110, 120, and 130, which have rear surfaces 110a, 120a, and 130a facing the screen display units 11, front surfaces 110c, 120c, and 130c that are opposite surfaces of the rear surfaces 110a, 120a, and 130a, and side surfaces 110b, 120b, and 130b connecting the front surfaces 110c, 120c, and 130c and the rear surfaces 110a, 120a, and 130a, in which the side surfaces 110b, 120b, and 130b are inclined to be widened outwardly in a front direction that is a direction from the rear surfaces 110a, 120a, and 130a to the front surfaces 110c, 120c, and 130c, that is, the side surfaces 110b, 120b, and 130b are inclined so that the front surfaces 110c, 120c, and 130c are wider than the rear surfaces 110a, 120a, and 130a, and which are provided to front surfaces of the screen display units 11 so as to cover all of the screen display units 11 while one-to-one corresponding to the screen display units 11.

The plurality of light transmissive covers 110, 120, and 130 are provided to the screen display units 11 while outer peripheral circumferences 110c', 120c', and 130c' of the front surfaces 110c, 120c, and 130c of the adjacent light transmissive covers 110, 120, and 130 are in contact with each other, and in order to prevent the bezels 12 from being visible, the light transmissive covers 110, 120, and 130 are provided to the screen display units 11 so that the bezels 12 are positioned in spaces between a pair of facing inclined side surfaces 110b, 120b, and 130b of the adjacent light transmissive covers 110, 120, and 130, that is, spaces S1 formed by the facing side surfaces 110B, 120B, and 130b.

According to the aforementioned configuration, there is an advantage in that the bezel 12 is invisible when the user views the multi-screen display device, and further, the bezel 12 is not visible when the user views the multi-screen display device within the outermost viewing angle, the multi-screen display device is visually viewed as if the image is displayed even on the side surfaces 110b, 120b, and 130b, and particularly, the light transmissive covers are provided so as to cover all of the screen display units 11, so that the user recognizes as if the image is not disconnected throughout the entire display device.

In the multi-screen display devices including the light transmissive covers with the invisible bezels according to first, second, and third exemplary embodiments of the present invention, the light transmissive covers 110, 120, and 130 are provided to the screen display units 11 so that angles β of the side surfaces 110b, 120b, and 130b of the light transmissive covers 110, 120, and 130 with respect to the screen display units 11 are maintained to be larger than 95° and be equal to or smaller than 125° (95°≤β≤125°).

More preferably, the light transmissive covers 110, 120, and 130 may be provided to the screen display units 11 so that angles β of the side surfaces 110b, 120b, and 130b of the light transmissive covers 110, 120, and 130 with respect to the screen display units 11 are 103.3°.

Accordingly, when the user views the display device within the outermost viewing angle, the bezels 12 are invisible, and the images of the screen display units 11 are reflected to the sides surfaces 110b, 120b, and 130b and are incident into the eyes of the user, so that the images are visually viewed as if the images are displayed even on the sides surfaces 110b, 120b, and 130b, and as a result, the user recognizes as if the image is not disconnected throughout the entire display device.

The light transmissive covers 110, 120, and 130 may be formed of, for example, acryl resin, glass, and crystal, but as long as a material is a light transmissive material allowing light to pass through, the material is included in the technical scope of the present invention as a matter of course.

In the light transmissive covers 110, 120, and 130, a reflective material is coated on the side surfaces 110b, 120b, and 130b so that total reflection is easily generated.

The reflective coating may be directly performed on the side surfaces, or may be performed by attaching a coating film onto the side surfaces, and a coating material coated for the reflection may use various configurations publicly known before the filing.

In the meantime, the light transmissive covers 110, 120, and 130 may be provided to the screen display units 11 by various publicly known fastening means or coupling means, such as a publicly known adhesive member (for example, a transparent adhesive) or a publicly known hanger.

In the light transmissive cover 110 according to the first exemplary embodiment of the present invention illustrated in FIGS. 2 and 3, the front surface 110c and the rear surface 110a are formed to be flat so that the rear surface 110a is in contact with the screen display unit 11.

In the light transmissive covers 120 and 130 according to the second and third embodiments of the present invention illustrated in FIGS. 4 to 7, the rear surfaces 120a and 130a are concavely formed in the front direction so that the rear surfaces 120a and 130a are spaced apart from the screen display units 11 without being in contact with the screen display units 11, and the front surfaces 120c and 130c are convexly formed in the front direction.

Accordingly, spaces Sa and Sb are formed between the light transmissive covers 120 and 130 and the screen display units 11.

In the multi-screen display device including the light transmissive cover with the invisible bezel according to the second exemplary embodiment of the present invention illustrated in FIGS. 4 and 5, a rear surface inclined portion 120a-1 is surface-inclined in the front direction and formed at an outer side of the rear surface 120a of the light transmissive cover 120, and a rear surface flat portion 120a-2 is flatly formed while being bent inwardly from the rear surface inclined portion 120a-1. As a result of the forming of the rear surface inclined portion 120a-1 and the rear surface flat portion 120a-2, the space Sa is formed between the screen display unit 11 and the rear surface 120a of the light transmissive cover 120.

Further, a front surface inclined portion 120c-1 is surface-inclined in the front direction and formed at an outer side of the front surface 120c of the light transmissive cover 120, and a front surface flat portion 120c-2 is flatly formed while being bent inwardly from the front surface inclined portion 120c-1.

In the multi-screen display device including the light transmissive cover with the invisible bezel according to the third exemplary embodiment of the present invention illustrated in FIGS. 6 and 7, the front surface 130c and the rear surface 130a of the light transmissive cover 130 are convexly formed in the front direction so as to be curved, and the space Sb is formed between the screen display unit 11 and the rear surface 130a of the light transmissive cover 130.

The light transmissive covers 120 and 130 according to the second and third exemplary embodiments of the present invention have more inventive technical characteristics than that of the light transmissive cover 110 according to the first exemplary embodiment due to a difference in a shape.

In the light transmissive covers 120 and 130 according to the second and third exemplary embodiments of the present invention, the rear surface inclined portion 120a-1 of the light transmissive cover 120 and the rear surface 130a (strictly, a tangent of the rear surface 130a) of the light transmissive cover 130 are inclined at an angle α with respect to the screen display units 11, respectively, and the front surface inclined portion 120c-1 of the light transmissive cover 120 and the front surface 130c (strictly, a tangent of the front surface 130c) of the light transmissive cover 130 are inclined at an angle γ with respect to the screen display units 11, respectively, and thus, there is a technical advantage in that the range of the outermost viewing angle is increased based on the right center (viewing angle θ=90°) in proportion to the angle α and the angle β.

Since a refraction angle of light is changed in the light transmissive covers 120 and 130 according to the second and third exemplary embodiments and the light transmissive cover 110 according to the first exemplary embodiment (Snell's Law), the range of the outermost viewing angle is increased as described above, which will be described below with reference to FIGS. 9 and 10 in more detail.

In order to avoid complexity of the drawing, FIGS. 9 and 10 illustrates an example of the light transmissive cover 120 according to the second exemplary embodiment, but in a case of the light transmissive cover 130 according to the third exemplary embodiment, the front surface is bent by an angle γ and the rear surface is bent by an angle α, so that the light transmissive cover 130 according to the third exemplary embodiment may be equally applied as the light transmissive cover 120 according to the second exemplary embodiment, and hereinafter, the case of the light transmissive cover 130 according to the third exemplary embodiment will be described together.

First, a reason of an increase in a viewing angle according to the bent of the front surface inclined portion 120c-1 of the light transmissive cover 120 by the angle γ and the bent of the front surface 130c of the light transmissive cover 130 by the angle γ will be described with reference to FIG. 9.

Typically, a refractive index of air is 1.00039, and refractive indexes of the light transmissive covers 110, 120, and 130 are 1.49 when the light transmissive covers 110, 120, and 130 are formed of transparent acryl, refractive indexes of the light transmissive covers 110, 120, and 130 are 1.53 when the light transmissive covers 110, 120, and 130 are formed of transparent poly carbonate (PC), and refractive indexes of the light transmissive covers 110, 120, and 130 are 1.523 when the light transmissive covers 110, 120, and 130 are formed of transparent glass.

When the light transmissive covers 120 and 130 according to the second and third exemplary embodiments and the light transmissive cover 110 according to the first exemplary embodiment are viewed in the same direction, that is, the light transmissive covers 120 and 130 according to the second and third exemplary embodiments and the light transmissive cover 110 according to the first exemplary embodiment have the same viewing angle θ, light is incident to a boundary point P1, so that an incident angle of the light transmissive cover 110 according to the first exemplary embodiment is λ1in, and a refraction angle of the light transmissive cover 110 according to the first exemplary embodiment is λ1out.

In the meantime, in the light transmissive covers 120 and 130 according to the second and third exemplary embodiments, the front surface inclined portion 120c-1 and the front surface 130c are bent by the angle γ, so that light is incident into a boundary point P2, and incident angles of the light transmissive covers 120 and 130 are λ1in+γ, and refraction angles λ2out of the light transmissive covers 120 and 130 are also larger than the refraction angle λ1out of the light transmissive cover 110 according to the first exemplary embodiment.

Accordingly, in the light transmissive covers 120 and 130 according to the second and third exemplary embodiments, the range of the outermost viewing angle is increased based on the right center (viewing angle θ=90°) in proportion to the angle γ, at which the front inclined portion 120c-1 and the front surface 130c are bent, or a size of d1−d2.

Next, a reason of an increase in the range of the outermost viewing angle based on the right center (viewing angle θ=90°) according to the bent of the rear surface inclined portion 120a-1 of the light transmissive cover 120 by the angle α and the bent of the rear surface 130a of the light transmissive cover 130 by the angle γ will be described with reference to FIG. 10.

As illustrated in FIG. 10 well, light reflected from the side surface 110b of the light transmissive cover 110 according to the first exemplary embodiment is not refracted, but light reflected from the side surfaces 120b and 130b of the light transmissive covers 120 and 130 according to the second and third exemplary embodiments is refracted from the rear surface inclined portion 120a-1 and the rear surface 130a, respectively, and thus, the larger region of the screen display unit 11 is reflected and viewed, and as a result, the range of the outermost viewing angle based on the right center is increased based on the right center (viewing angle θ=90°).

As a result, in the light transmissive covers 120 and 130 according to the second and third exemplary embodiments, the front surface inclined portion 120c-1 and the front surface 130c are bent by the angle γ, so that the ranges of the viewing angles are increased, and in addition, when the rear surface inclined portion 120a-1 and the rear surface 130a are bent by the angle α, the ranges of the viewing angles are further increased.

FIG. 8 is a perspective view of a bottom surface of a modelling of the light transmissive cover 130 with the invisible bezel according to the third exemplary embodiment, and an entire shape of the light transmissive cover 120 according to the second exemplary embodiment is also similar to the shape of FIG. 8.

In the multi-screen display device including the light transmissive cover with the invisible bezel according to the second exemplary embodiment, the light transmissive cover 120 is provided to the screen display unit 11 so that a sum of the angle β of the side surface 120b of the light transmissive cover 120 with respect to the screen display unit 11, the angle α of the rear surface inclined portion 120a-1 of the rear surface 120a of the light transmissive cover 120 with respect to the screen display unit 11, the angle γ of the front surface inclined portion 120c-1 of the front surface 120c of the light transmissive cover 120 with respect to the screen display unit 11, and the angle (viewing angle θ), at which the user views the screen, is maintained to be 180° to 260°.

Similarly, as illustrated in FIGS. 6 and 7, in the multi-screen display device including the light transmissive cover with the invisible bezel according to the third exemplary embodiment, the light transmissive cover 130 is provided to the screen display unit 11 so that a sum of the angle β of the side surface 130b of the light transmissive cover 130 with respect to the screen display unit 11, the angle α of the rear surface 130a of the light transmissive cover 130 with respect to the screen display unit 11, the angle γ of the front surface 130c of the light transmissive cover 130 with respect to the screen display unit 11, and the angle (viewing angle θ), at which the user views the screen, is maintained to be 180° to 260°.

The angle α between the screen display unit 11 and the rear surface 130a of the light transmissive cover 130 strictly refers to an angle formed between a tangent of the rear surface 130a of the light transmissive cover 130 and the screen display unit 11, and the angle γ of the front surface 130c of the light transmissive cover 130 with respect to the screen display unit 11 strictly refers to an angle formed between a tangent of the front surface 130c of the light transmissive cover 130 and the screen display unit 11.

As described above, in a case of the light transmissive covers 120 and 130 according to the second and third exemplary embodiments, the basis for limiting the angle range so that the sum of the angle β of the side surfaces 120b and 130b with respect to the screen display unit 11, the angle α of the rear surface inclined portion 120a-1 with respect to the screen display unit 11, the angle γ of the front surface inclined portion 120c-1 with respect to the screen display unit 11, and the angle (viewing angle), at which the user views the screen, is maintained to be 180° to 260°, is that an optimal experimental data value, with which an image is transmissive or an image is not visible based on 95° to 125° of the value of the angle β of the side surface, was found through a long trial and error, and a value of the angle α is 13.3°, a value of the angle β is 103.3°, a value of the angle γ is 13.3°, and the viewing angle θ is 90°.

Further, based on that the angle α+the angle β+the angle γ+the viewing angle θ=219.9°≈220°, a value of the viewing angle θ is set to 180° to 260° considering +40° to −40° (symbol − means a counterclockwise direction).

Further, in the multi-screen display device including the light transmissive cover with the invisible bezel according to the second exemplary embodiment, the light transmissive cover 120 is provided to the screen display unit 11 so that angle γ of the front surface inclined portion 120c-1 of the front surface 120c of the light transmissive cover 120 with respect to the screen display unit 11 is larger than 0° and is equal to or smaller than 45° (0°<γ≤45°).

More preferably, the light transmissive cover 120 is provided to the screen display unit 11 so that angle γ of the front surface inclined portion 120c-1 of the front surface 120c of the light transmissive cover 120 with respect to the screen display unit 11 is 13.3°.

Further, the light transmissive cover 120 is provided to the screen display unit 11 so that angle α of the rear surface inclined portion 120a-1 of the rear surface 120a of the light transmissive cover 120 with respect to the screen display unit 11 is larger than 0° and is equal to or smaller than 45° (0°<α≤45°).

More preferably, the light transmissive cover 120 is provided to the screen display unit 11 so that angle α of the rear surface inclined portion 120a-1 of the rear surface 120a of the light transmissive cover 120 with respect to the screen display unit 11 is 13.3°.

Similarly, in the multi-screen display device including the light transmissive cover with the invisible bezel according to the third exemplary embodiment illustrated in FIGS. 6 and 7, the light transmissive cover 130 is provided to the screen display unit 11 so that angle γ of the front surface 130c of the light transmissive cover 130 with respect to the screen display unit 11 is 0°<γ≤45°.

More preferably, the light transmissive cover 130 is provided to the screen display unit 11 so that angle γ of the front surface 130c of the light transmissive cover 130 with respect to the screen display unit 11 is 13.3°.

The light transmissive cover 130 is provided to the screen display unit 11 so that angle α of the rear surface 130c of the light transmissive cover 130 with respect to the screen display unit 11 is 0<α≤45°.

More preferably, the light transmissive cover 130 may be provided to the screen display unit 11 so that angles α of the rear surface 130c of the light transmissive cover 130 with respect to the screen display unit 11 is 13.3°.

According to the aforementioned configuration, when the user views the display device within a specific angle (for example, the outermost viewing angle), the bezel 12 is not visible and the image of the screen display unit 11 is reflected and is viewed on the side surfaces 120b and 130b, and thus the screen is viewed without a disconnection throughout the entire display device including the regions, in which the bezels are located, so that the user visually recognizes as if the image is normally displayed on the entire display device.

When the user views the display device while deviating from the outermost viewing angle, or the light transmissive covers 120 and 130 are provided to the screen display units 11 so as not to satisfy the conditions of the angles α, β, and γ, the image of the screen display unit 11 cannot be reflected to the side surfaces 120b and 130b and thus the reflected image of the image of the screen display unit 11 is invisible and the reflected image is not displayed on the side surfaces 120b and 130b (see FIGS. 14 and 16).

An operation of the multi-screen display device including the light transmissive cover with the invisible bezel according to the exemplary embodiment including the aforementioned configuration will be described.

FIG. 3 is an enlarged view of a main part of FIG. 2 and illustrates an optical path, FIG. 5 is an enlarged view of a main part of FIG. 4 and illustrates an optical path, and FIG. 7 is an enlarged view of a main part of FIG. 6 and illustrates an optical path.

That is, an optical path, through which the image of the screen display unit 11 is reflected to the side surfaces 110b, 120b, and 130b and is incident into the eyes of the user, is represented well in FIGS. 3, 5, and 7, and when the user views the side surfaces 110b, 120b, and 130b of the light transmissive covers 110, 120, and 130 within the outermost viewing angle (for example, 30°, and 180°−30°), the user views the reflected image of the image of the screen display unit 11 as indicated on the optical path.

Now, a unique effect of the present invention in that the bezels 12 are invisible and an image is not disconnected through the entire display device by the light transmissive covers 110, 120, and 130 according to the exemplary embodiments of the present invention will be described through the experimental pictures illustrated in FIGS. 11 to 16.

FIG. 11 is a picture showing the bezel 12 and the screen display unit 11 for an experiment in a state where the light transmissive covers 110, 120, and 130 with the invisible bezels according to the exemplary embodiments of the present invention are not present.

FIG. 12 is a picture of a case where a pair of light transmissive covers 110, 120, and 130 with the invisible bezels according to the exemplary embodiments of the present invention is disposed based on the bezel 12, in which a user views the display device at a position (the right center position) of the viewing angle θ of 90°, and it can be seen that the bezel 12 is invisible, and further, the screen of the screen display unit 11 is mirror-symmetrically reflected to the side surfaces 110b, 120b, and 130b of the light transmissive covers 110, 120, and 130.

FIG. 13 is a picture of a case where a user views the display device with an inclination by about 30° in a right direction (the −x-axis direction) in FIG. 12 (so that the viewing angle θ is about 120°), and it can be seen that the bezel 12 is still invisible, and an image of the screen display unit 12 is still reflected to and displayed on the side surfaces 110b, 120b, and 130b.

FIG. 14 is a picture of a case where a user views the display device while deviating from the outermost viewing angle (for example, 180°−30°=150°) by further leaning from the right center position in the right direction in FIG. 13, and it can be seen that the bezel 12 is still invisible, but a reflected image of the image of the screen display unit 11 is not displayed on the side surfaces 110b, 120b, and 130b and colors from the unique material of the light transmissive covers 110, 120, and 130 are represented, in this case, the bezel 12 is invisible, but the image is viewed as being disconnected by the colors from the unique materials of the light transmissive covers 110, 120, and 130 in terms of the entire display device.

FIG. 15 is a picture of the bezel and the screen display unit viewed at a symmetric angle of FIG. 13, and similar to FIG. 13, the bezel is invisible and the reflected image of the image of the screen display unit is displayed on the side surfaces 110b, 120b, and 130b.

FIG. 16 is a picture of the bezel and the screen display unit viewed at a symmetric angle of FIG. 14 (a picture viewed in the x-axis direction), in which a user views the display device while deviating from the outermost viewing angle (the user views the display device in the x-axis direction, so that the outermost viewing angle is 30°) (for example, 0°<viewing angle θ<30°), and it can be seen that the bezel 12 is still invisible, but the reflected image of the image of the screen display unit 11 is not displayed on the side surfaces 110b, 120b, and 130b, and the colors from the unique materials of the light transmissive covers 110, 120, and 130 are shown.

As can be seen through the experiment pictures, when the user views the screen display unit 11 within the range of the outermost viewing angle, as illustrated well in FIGS. 12, 13, and 15, the image of the screen display unit 11 is reflected to the side surfaces 110b, 120b, and 130b, and when the user views the side surfaces 110b, 120b, and 130b, the user views the reflected image of the image of the screen display unit 11, so that the user visually recognizes as if normal and real image is displayed even on the side surfaces 110b, 120b, and 130b, and it seems like that there is no disconnection in the image at all in terms of the entire region of the display device.

Further, it can be seen that when the user views the screen display unit while deviating from the outermost viewing angle (for example, 30° and 150° (=180°−30°)) (0°<viewing angle θ<30° or 150°<viewing angle θ<180°), the bezel is invisible, but the reflected image of the image of the screen display unit, which is reflected to the side surfaces 110b, 120b, and 130b, cannot be viewed, and the screen is disconnected by the colors from the unique materials of the light transmissive covers 110, 120, and 130.

When the light transmissive covers 110, 120, and 130 according to the exemplary embodiments of the present invention are disposed in the screen display units 11, the bezel is invisible, and the reason is that when the bezel 12 is positioned within the space S1 formed by the facing side surfaces 110b, 120b, and 130b of the pair of light transmissive covers 110, 120, and 130, the pair of light transmissive covers 110, 120, and 130 serves as like a wave guide, so that light emitted from the bezel 12 is propagated along the light transmissive covers 110, 120, and 130, which serve as the wave guide, and cannot be incident into the eyes of the user located at the front side of the light transmissive covers 110, 120, and 130, not the lateral side of the light transmissive covers 110, 120, and 130, and as a result, the user cannot visually recognize the bezel 12 within the space S1.

A picture for representing the technical effect in that the bezel is invisible when the light transmissive cover with the invisible bezel according to the exemplary embodiment of the present invention is provided to the multi-screen display device, on which an image is actually displayed, is shown in FIGS. 17 and 18.

FIG. 17 is a picture of a state in which a general multi-screen display device is operated, so that an image is displayed on a screen display unit, and it can be seen that the light transmissive cover with the invisible bezel according to the exemplary embodiment of the present invention is not provided, so that the bezel is clearly visible.

FIG. 18 is a picture of a state in which only the light transmissive cover according to the exemplary embodiment of the present invention is disposed in the screen display unit in the multi-screen display device, on which the image is displayed, illustrated in FIG. 17, and in this case, it can be seen that the bezel is invisible.

While the preferred exemplary embodiments according to the present invention have been described above, it is obvious to those skilled in the art that in addition to the aforementioned exemplary embodiments, the present invention may be implemented as other specific forms without departing from the purpose and the scope of the present invention.

Accordingly, the aforementioned exemplary embodiments should be only illustrative and not restrictive for this invention, and thus, the present invention is not limited to the aforementioned description, but may be modified within the scope of the appended claims and equivalents thereto.

The invention claimed is:

1. A multi-screen display device including a light transmissive cover with an invisible bezel, the multi-screen display device comprising:
   a plurality of screen display units (11);
   bezels (12) formed between the screen display units (11); and
   a plurality of light transmissive covers (120), each of which has a rear surface (120a) facing the screen display unit (11), a front surface (120c) that is an opposite surface of the rear surface (120a), and a side surface (120b) connecting the front surface (120c) and the rear surface (120a), and is provided to the front surfaces of the screen display units (11) so as to cover the screen display units (11) while one-to-one corresponding to the screen display units (11), the side surface (120b) being inclined to be widened outwardly in a front direction,
   wherein the plurality of light transmissive covers (120) is provided to the screen display units (11) while outer peripheral circumferences (120') of the front surfaces (120c) of the adjacent light transmissive covers are in contact with each other,
   the light transmissive cover (120) is provided to the screen display unit (11) so that the bezel (12) is positioned between the pair of facing inclined side surfaces (120b) of the adjacent light transmissive covers (120) in order to prevent the bezel (12) from being visible,
   a rear surface inclined portion (120a-1) is surface-inclined in the front direction at an outer side of the rear surface (120a) of the light transmissive cover (120), and a rear surface flat portion (120a-2) is flatly formed while being bent inwardly from the rear surface inclined portion (120a-1),
   a front surface inclined portion (120c-1) is surface-inclined at an outer side of the front surface (120c) of the light transmissive cover (120) in the front direction, and a front surface flat portion (120c-2) is flatly formed while being bent inwardly from the front surface inclined portion (120c-1), and
   a space (Sa) is formed between the screen display unit (11) and the rear surface (120a) of the light transmissive cover (120).

2. The multi-screen display device of claim 1, wherein the light transmissive cover (120) is provided to the screen display unit (11) so that an angle (β) of the side surface (120b) of the light transmissive cover (120) with respect to the screen display unit (11) is 95°<β≤125°.

3. The multi-screen display device of claim 2, wherein the light transmissive cover (120) is provided to the screen display unit (11) so that a sum of the angle (β) of the side surface (120b) of the light transmissive cover (120) with respect to the screen display unit (11), an angle (α) of the rear surface inclined portion (120a-1) of the rear surface (120a) of the light transmissive cover (120) with respect to the screen display unit (11), an angle (γ) of the front surface inclined portion (120c-1) of the front surface (120c) of the light transmissive cover (120) with respect to the screen display unit (11), and an angle (viewing angle), at which a user views a screen, is maintained to be 180° to 260°.

4. The multi-screen display device of claim 1, wherein the light transmissive cover (120) is provided to the screen display unit (11) so that an angle (γ) of the front surface inclined portion (120c-1) of the front surface (120c) of the light transmissive cover (120) with respect to the screen display unit (11) is 0°<γ≤45°.

5. The multi-screen display device of claim 1, wherein the light transmissive cover (120) is provided to the screen display unit (11) so that an angle (α) of the rear surface inclined portion (120a-1) of the rear surface (120a) of the light transmissive cover (120) with respect to the screen display unit (11) is 0°<α≤45°.

6. The multi-screen display device of claim 1, wherein a reflective material is coated on the side surface (120b) so that total reflection is easily generated.

7. The multi-screen display device of claim 1, wherein the light transmissive cover (120) is formed of any one selected from acryl resin, glass, and crystal.

8. A multi-screen display device including a light transmissive cover with an invisible bezel, the multi-screen display device comprising:
   a plurality of screen display units (11);
   bezels (12) formed between the screen display units (11); and
   a plurality of light transmissive covers (130), each of which has a rear surface (130a) facing the screen display unit (11), a front surface (130c) that is an opposite surface of the rear surface (130a), and a side surface (130b) connecting the front surface (130c) and the rear surface (130a), and is provided to the front surfaces of the screen display units (11) so as to cover the screen display units (11) while one-to-one corresponding to the screen display units (11), the side surface (130b) being inclined to be widened outwardly in a front direction,
   wherein the plurality of light transmissive covers (130) is provided to the screen display units (11) while outer peripheral circumferences (130c') of the front surfaces (130c) of the adjacent light transmissive covers are in contact with each other,
   the light transmissive cover (130) is provided to the screen display unit (11) so that the bezel (12) is positioned between the pair of facing inclined side surfaces (130b) of the adjacent light transmissive covers (130) in order to prevent the bezel (12) from being visible,
   the front surface (130c) and the rear surface (130a) of the light transmissive cover are convexly formed in a front direction so as to be curved, and
   a space (Sb) is formed between the screen display unit (11) and the rear surface (130a) of the light transmissive cover (130).

9. The multi-screen display device of claim 8, wherein the light transmissive cover (130) is provided to the screen display unit (11) so that an angle (β) of the side surface (130b) of the light transmissive cover (130) with respect to the screen display unit (11) is 95°<β≤125°.

10. The multi-screen display device of claim 9, wherein the light transmissive cover (130) is provided to the screen display unit (11) so that a sum of the angle (β) of the side surface (130b) of the light transmissive cover (130) with respect to the screen display unit (11), an angle (α) of the rear surface (130a) of the light transmissive cover (130) with respect to the screen display unit (11), an angle (γ) of the front surface (130c) of the light transmissive cover (130)

with respect to the screen display unit (11), and an angle (viewing angle), at which a user views the screen, is maintained to be 180° to 260°.

11. The multi-screen display device of claim 8, wherein the light transmissive cover (130) is provided to the screen display unit (11) so that an angle (γ) of the front surface (130*c*) of the light transmissive cover (130) with respect to the screen display unit (11) is $0°<\beta\leq 45°$.

12. The multi-screen display device of claim 8, wherein the light transmissive cover (130) is provided to the screen display unit (11) so that an angle (α) of the rear surface (130*a*) of the light transmissive cover (130) with respect to the screen display unit (11) is $0°<\beta\leq 45°$.

13. The multi-screen display device of claim 8, wherein a reflective material is coated on the side surface (130*b*) of the light transmissive cover (130) so that total reflection is easily generated.

14. The multi-screen display device of claim 8, wherein the light transmissive cover (130) is formed of any one selected from acryl resin, glass, and crystal.

* * * * *